United States Patent
Balachandran (10) Patent No.: US 7,916,058 B1
(45) Date of Patent: Mar. 29, 2011

(54) DIGITAL-TO-ANALOG CONVERTER (DAC) WITH REFERENCE-ROTATED DAC ELEMENTS

(75) Inventor: Ganesh K. Balachandran, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/573,378

(22) Filed: Oct. 5, 2009

(51) Int. Cl.
*H03M 1/66* (2006.01)
(52) U.S. Cl. .................. 341/144; 341/118; 341/153
(58) Field of Classification Search .............. 341/144
See application file for complete search history.

(56) References Cited

U.S. PATENT DOCUMENTS

| | | | | |
|---|---|---|---|---|
| 5,404,142 A | * | 4/1995 | Adams et al. | 341/144 |
| 6,522,277 B2 | * | 2/2003 | Fujimori et al. | 341/144 |
| 6,535,155 B2 | * | 3/2003 | Ruha et al. | 341/144 |
| 7,324,032 B2 | * | 1/2008 | Kim | 341/144 |
| 7,463,175 B2 | * | 12/2008 | Kim | 341/126 |
| 7,719,455 B2 | * | 5/2010 | Kim et al. | 341/144 |

OTHER PUBLICATIONS

Baird, Rex T. et al., "Linearity Enhancement of Multibit ΔΣ A/D and D/A Converters Using Data Weighted Averaging," IEEE Transactions On Circuits And Systems-II: Analog And Digital Signal Processing, vol. 42, No. 12, Dec. 1995, 10 pages.

* cited by examiner

*Primary Examiner* — Khai M Nguyen
(74) *Attorney, Agent, or Firm* — John R. Pessetto; W. James Brady; Frederick J. Telecky, Jr.

(57) ABSTRACT

In accordance with at least some embodiments, an electronic device comprises a digital-to-analog converter (DAC) having a DAC element array. Reference-rotated data weighted averaging (RRDWA) is applied to the DAC element array.

12 Claims, 6 Drawing Sheets

DIGITAL-TO-ANALOG CONVERTER (DAC) WITH REFERENCE-ROTATED DAC ELEMENTS

BACKGROUND

Digital-to-analog converters (DACs) are implemented in many electronic devices. The process of outputting an analog signal that corresponds to a digital input relies on imperfect components. Accordingly, DAC design often accounts for such imperfections. As an example, oversampling and Dynamic Element Matching (DEM) are two techniques that may be used improve DAC performance. DEM refers to selecting different DAC elements to represent a given digital code at different times, thereby translating element mismatches (DC error) into a wideband high-pass-shaped noise. The shaped mismatch noise which resides at high frequency can then be filtered out. Data-weighted averaging (DWA) is a practical DEM technique albeit still imperfect. In DWA, DAC elements participating in digital-to-analog conversion are sequentially selected from a DAC array, beginning with the next available unused DAC element. Several variations of DWA have been developed such as dithered DWA, incremental DWA (IDWA), bi-directional DWA (Bi-DWA), partitioned DWA (P-DWA), rotated DWA (RDWA), randomized DWA (RnDWA), and pseudo DWA. Although DWA techniques are effective for overcoming issues such as DAC element mismatches, existing DWA techniques do not overcome flicker noise in DAC elements. As transistor processes (e.g., complementary metal-oxide semiconductor (CMOS) processes) for DACs are reduced in size, flicker noise in DAC elements increases.

SUMMARY

In at least some embodiments, an electronic device comprises a digital-to-analog converter (DAC) having a DAC element array. Reference-rotated data weighted averaging (RRDWA) is applied to the DAC element array.

In at least some embodiments, a digital-to-analog converter (DAC) comprises a plurality of DAC elements, wherein each DAC element is selectable as a reference element. The DAC further comprises element selection logic coupled to the plurality of DAC elements. The element selection logic rotates DAC elements selected as reference elements.

In at least some embodiments, a digital-to-analog converter (DAC) method comprises operating a plurality of DAC elements at a predetermined frequency. The DAC method further comprises rotatively selecting each of the plurality of DAC elements as a reference element.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Embodiments of the disclosure are directed to a reference-rotated data-weighted average ("RRDWA") technique for overcoming flicker noise in DAC elements. As used herein, RRDWA refers to dynamically rotating, among a plurality of DAC elements, which DAC element (or elements) is used as a reference element. Accordingly, various features of the RRDWA concept are described herein. Further, an RRDWA simulation circuit and simulation results are provided.

Figure 1:
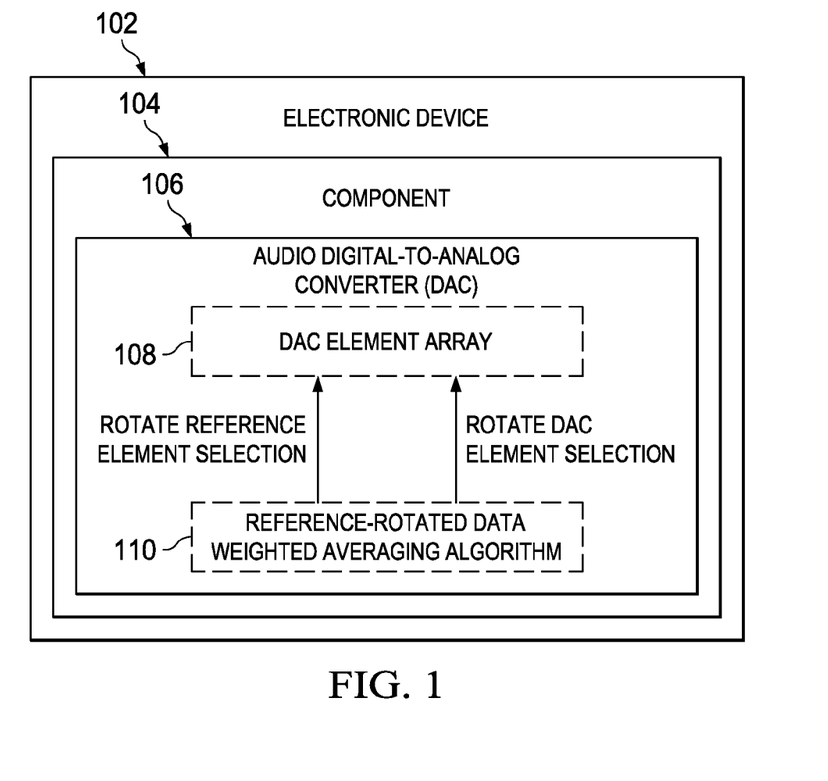
FIG. 1 shows an electronic device in accordance with an embodiment of the disclosure.

FIG. 1 shows an electronic device 102 in accordance with an embodiment of the disclosure. As shown, the electronic device 102 comprises a component 104 having an "audio" DAC 106. As used herein, an "audio" DAC refers to a DAC configured to perform DAC operations compatible with audio applications. As an example, an audio DAC may be designed to operate effectively in the bandwidth of 20 Hz to 20 kHz and may have a dynamic range of 100 dB. There are many electronic devices that may implement the audio DAC 106. For example, the electronic device 102 may correspond to a laptop computer, a "netbook", a smart phone, a cell phone, or other devices that provide an analog audio output. The component 104 may correspond to a semiconductor chip that implements the audio DAC 106. For example, the component 104 may implement the audio DAC 106 based on a complementary metal-oxide semiconductor (CMOS) process (e.g., a 65 nm process, a 45 nm process, or a 28 nm process). As smaller CMOS processes are used, the in-band flicker noise effect increases.

As shown in FIG. 1, the audio DAC 106 comprises a DAC element array 108 controlled by an RRDWA algorithm 110.

The RRDWA algorithm 110 dynamically rotates, among a plurality of DAC elements in the DAC element array 108, which DAC element (or elements) is used as a reference element. In some embodiments, the component 104 also may comprise additional circuitry related to processing data or otherwise controlling the electronic device 102. In operation, the audio DAC 106 uses the RRDWA algorithm 110 to reduce an in-band flicker noise effect to less than about 100 dB below a signal level. In part, the reduction of in-band flicker noise effect is based on an oversampling ratio that smears noise over a frequency range of 0 to the DAC clock frequency (6 MHz in this example). In some embodiments, the RRDWA algorithm 110 whitens DAC element flicker noise into thermal noise levels and also eliminates distortions due to DAC element mismatches.

Figure 2:
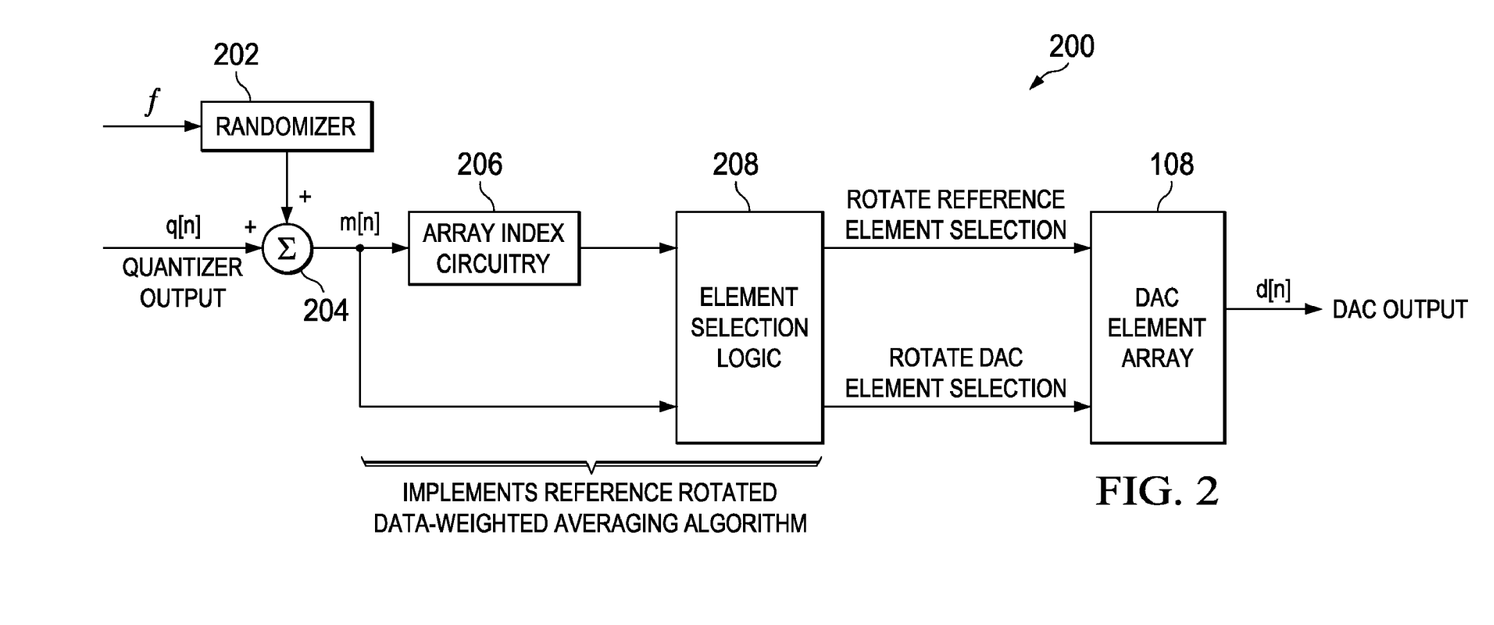
FIG. 2 shows a Reference-Rotated Data Weighted Averaging (RRDWA) digital-to-analog converter (DAC) in accordance with an embodiment of the disclosure.

FIG. 2 shows an RRDWA DAC 200 in accordance with an embodiment of the disclosure. The RRDWA DAC 200 may correspond to at least some of the components of the audio DAC 106 of FIG. 1. As shown in FIG. 2, the RRDWA DAC 200 comprises summation logic 204 that sums a quantizer output ("q[n]") with the output of a randomizer block 202. The randomizer block 202 operates at a predetermined frequency ("f"). The output of the summation block 204 ("m[n]") is received by array index circuitry 206, which dynamically selects at least one DAC element in the DAC element array 108 as a reference element. The number of reference elements that are selected depends on the number DAC elements assigned to each reference element. For different RRDWA DAC embodiments, the number of DAC elements assigned to each REF element may vary.

In at least some embodiments, the array index circuitry 206 provides a control signal to element selection logic 208 for dynamic rotation of DAC elements and REF elements in the DAC element array 108. In addition, the array index circuitry 206 may provide control signals to the element selection logic 208 for selection of DAC elements in the DAC element array 108 as positive output DAC elements or negative output DAC elements. The combined operation of the array index circuitry 206 and the element selection logic 208 correspond to the RRDWA algorithm 110 of FIG. 1.

In accordance with various embodiments, the array index circuitry 206 and the element selection logic 208 may be implemented in different ways. The purpose of the array index circuitry 206 is to implement a reference element selection scheme that causes each DAC element in the DAC element array 108 to be selected as a reference element approximately equally during DAC operation. In at least some embodiments, the reference element selection scheme may be described as a plurality of sequential selection cycles, where each DAC element in the DAC element array 108 is selected once for each selection cycle. Once a selection cycle is complete, a new selection cycle begins. The selection pattern for each selection cycle may be either random or predetermined.

In at least some embodiments, the array index circuitry 206 models an index corresponding to the DAC elements of the DAC element array 108. The index model may be based on hardware, software, or a combination thereof. With the index model, the array index circuitry 206 is able to track reference element selection parameters such as which DAC elements were previously selected as a reference element for a given selection cycle, which DAC elements are currently selected as a reference element for the given selection cycle and/or which DAC elements have not yet been selected as a reference element for the given selection cycle. Based on a determination of such reference element selection parameters, the array index circuitry 206 outputs a control signal to the element selection logic 208, which may correspond to a switch array. In addition to dynamically selecting DAC elements of the DAC element array 108 as reference elements, the element selection logic 208 also causes each DAC element that is not selected as a reference element to be selected as either a positive output DAC element or a negative output DAC element. The selection of DAC elements as either a positive output DAC element or a negative output DAC element may be based on a control code received by the RRDWA DAC 200. The output ("d[n]") of the RRDWA DAC 200 may be provided to a low-pass filter or other circuitry.

Figure 3:
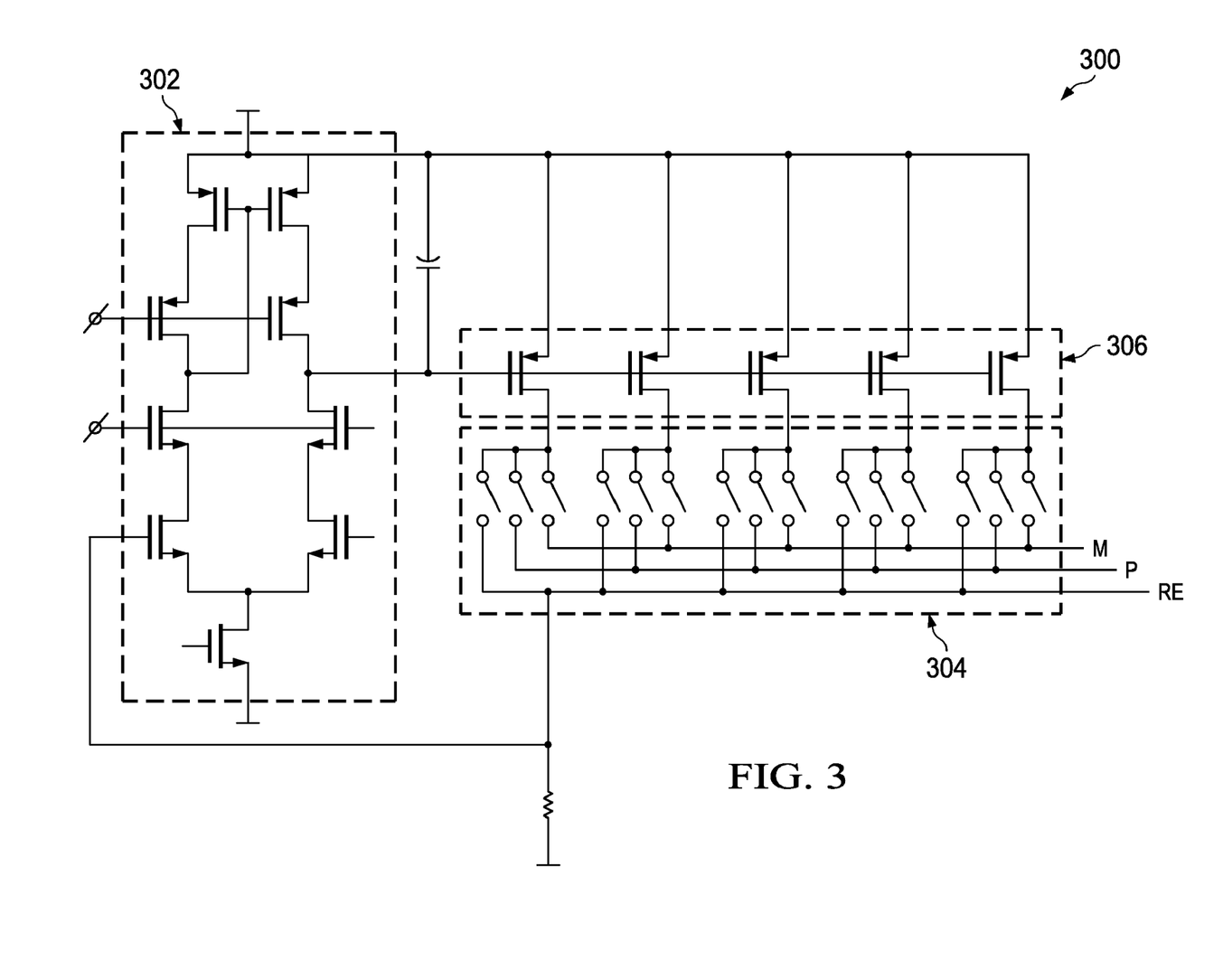
FIG. 3 shows components of an RRDWA DAC circuit in accordance with an embodiment of the disclosure.

FIG. 3 shows components of an RRDWA DAC circuit 300 in accordance with an embodiment of the disclosure. The RRDWA DAC 300 may correspond to at least some components of the audio DAC 106 of FIG. 1 or the DAC 200 of FIG. 2. As shown in FIG. 3, the RRDWA DAC 300 comprises an operational amplifier (op amp) 302 coupled to DAC elements of a DAC element array 306. More specifically, the DAC elements comprise 5 transistors and the op amp 302 provides an output to each transistor gate. Meanwhile, each transistor source is coupled to a voltage source and each transistor drain is coupled to the element selection logic 304. As shown, the element selection logic 304 may comprise a set of switches for each transistor of the DAC element array 302. More specifically, the element selection logic 304 selectively connects each transistor output as an M output (corresponding to a positive output DAC element), a P output (corresponding to a negative output DAC element), or a REF output. M and P outputs selected by the element selection logic 304 are combined for use as the analog signal representing a digital code input received by the RRDWA DAC 300. In contrast, REF outputs selected by the element selection logic 304 are provided in a feedback loop to the op amp 302. For FIG. 3, RRDWA is implemented to rotate selection of each transistor in the DAC element array 306 as the reference element.

FIG. 3 will now be used to prove that the RRDWA concept is independent of the reference amplifier bandwidth. In other words, one RRDWA feature is that the average noise for RRDWA, assuming a low reference amplifier bandwidth, is zero. More specifically, if 1 transistor of the DAC element array 306 is noisy, the average noise when RRDWA is applied is zero. To prove this conclusion, assume selection of the 5 transistors of the DAC element array 306 as the reference element is rotated at a clock frequency of 6 MHz. Also, assume only one of the 5 transistors has noise. In such case, the noisy transistor is selected as the reference element 1 out of 5 times for each selection cycle. For the analysis, superposition may be used with the final result being multiplied by sqrt(5). Since the loop bandwidth is approximately 100 kHz (i.e., the loop bandwidth is much less than 6 Mhz), only the average would be corrected. Therefore, the gate of the noisy transistor will develop a voltage of $-i_n/(5*Gm)$.

In FIG. 3, digital input codes may cause up to 4 transistors to be selected as either positive output DAC elements or negative output DAC elements. As an example, the second highest digital input code would cause 3 transistors to be selected as positive output DAC elements (3 P outputs) and 1 transistor to be selected as a negative output DAC element (1 M output). In such case, the noisy gate voltage mentioned previously (i.e., $-i_n/(5*Gm)$) causes the output current to be $-2i_n$ (i.e., $-3i_n-(-i_n)$). Further, out of 5 clock cycles, the noisy transistor is selected as P 3 times, as M once, and as REF once. Therefore, assuming low reference amplifier bandwidth, the average current for the second higher digital input code $3i_n/5-i_n/5=2i_n/5$ and the average noise is $-2i_n/5+2i_n/5=0$.

Another RRDWA feature is that the average noise for RRDWA, assuming a high reference amplifier bandwidth, is zero. In other words, RRDWA may be implemented to cancel flicker noise regardless of the bandwidth of the op amp 302. To prove this conclusion, assume selection of the 5 transistors of the DAC element array 306 as the reference element is rotated at a clock frequency of 6 MHz. Also, assume only one of the 5 transistors has noise. In such case, the noisy transistor is selected as the reference element 1 out of 5 times for each selection cycle. For the analysis, superposition may be used with the final result being multiplied by sqrt(5). Since the loop bandwidth is high (i.e., the loop bandwidth is much greater than 6 Mhz), the noise will be corrected upon selection of the noisy transistor as the reference element. Therefore, the gate of the noisy transistor will develop a voltage of $-i_n/(Gm)$ when the noisy transistor is selected as the reference element and a voltage of 0 otherwise.

In FIG. 3, digital input codes may cause up to 4 transistors to be selected as either positive output DAC elements or negative output DAC elements. As an example, the second highest digital input code would cause 3 transistors to be selected as positive output DAC elements (3 P outputs) and 1 transistor to be selected as a negative output DAC element (1 M output). In such case, the noisy gate voltage mentioned previously (i.e., $-i_n/(Gm)$) causes the output current to be $-2i_n$ (i.e., $-3i_n-(-i_n)$) for 1 clock cycle and 0 for 4 clock cycles. Thus, the average current for 5 clock cycles is $-2i_n/5$. Further, out of 5 clock cycles, the noisy transistor is selected as P 3 times, as M once, and as REF once. Therefore, the average current for the second highest digital input code is $3i_n/5-i_n/5=2i_n/5$ and the average noise is $-2i_n/5+2i_n/5=0$.

Figure 4:
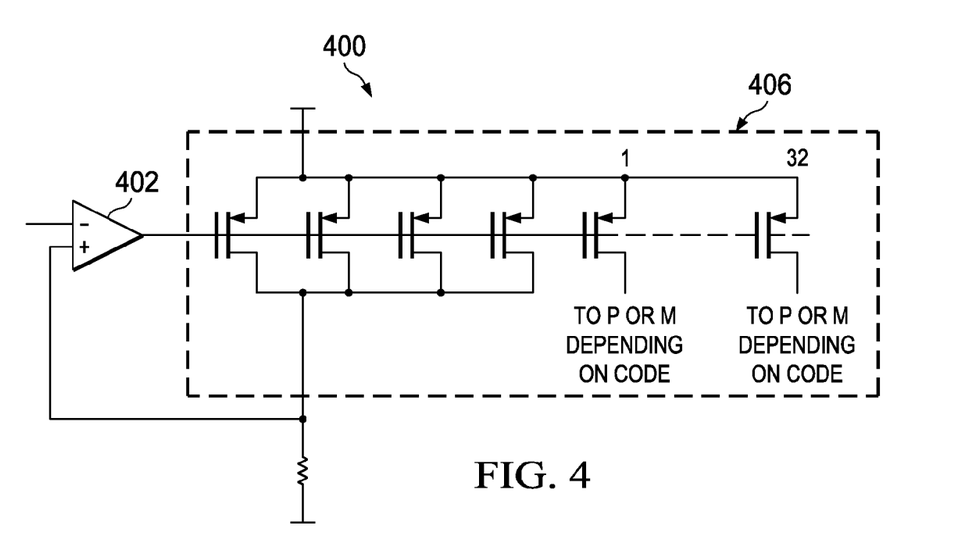
FIG. 4 shows a "snapshot" of RRDWA DAC operations in accordance with an embodiment of the disclosure.

FIG. 4 shows a "snapshot" of RRDWA DAC operations in accordance with an embodiment of the disclosure. The RRDWA DAC 400 of FIG. 4 may correspond to at least some components of the audio DAC 106 of FIG. 1 or the DAC 200 of FIG. 2. As shown in FIG. 4, the DAC 400 comprises an operational amplifier (op amp) 402 coupled to DAC elements of a DAC element array 406. More specifically, the DAC elements comprise 36 transistors and the op amp 402 provides an output to each transistor gate. Meanwhile, each transistor source is coupled to a voltage source and each transistor drain corresponds to a P output, an M output, or a REF output. In FIG. 4, 32 of 36 transistors are connected as either M outputs or P outputs for each clock cycle (depending on the digital code input) and 4 of 36 transistors are connected as REF outputs for each clock cycle. The selected REF outputs are connected via a feedback loop to the positive input of the op amp 402. For FIG. 4, RRDWA is implemented to rotate selection of each transistor in the DAC element array 406 as the reference element.

Figure 5:
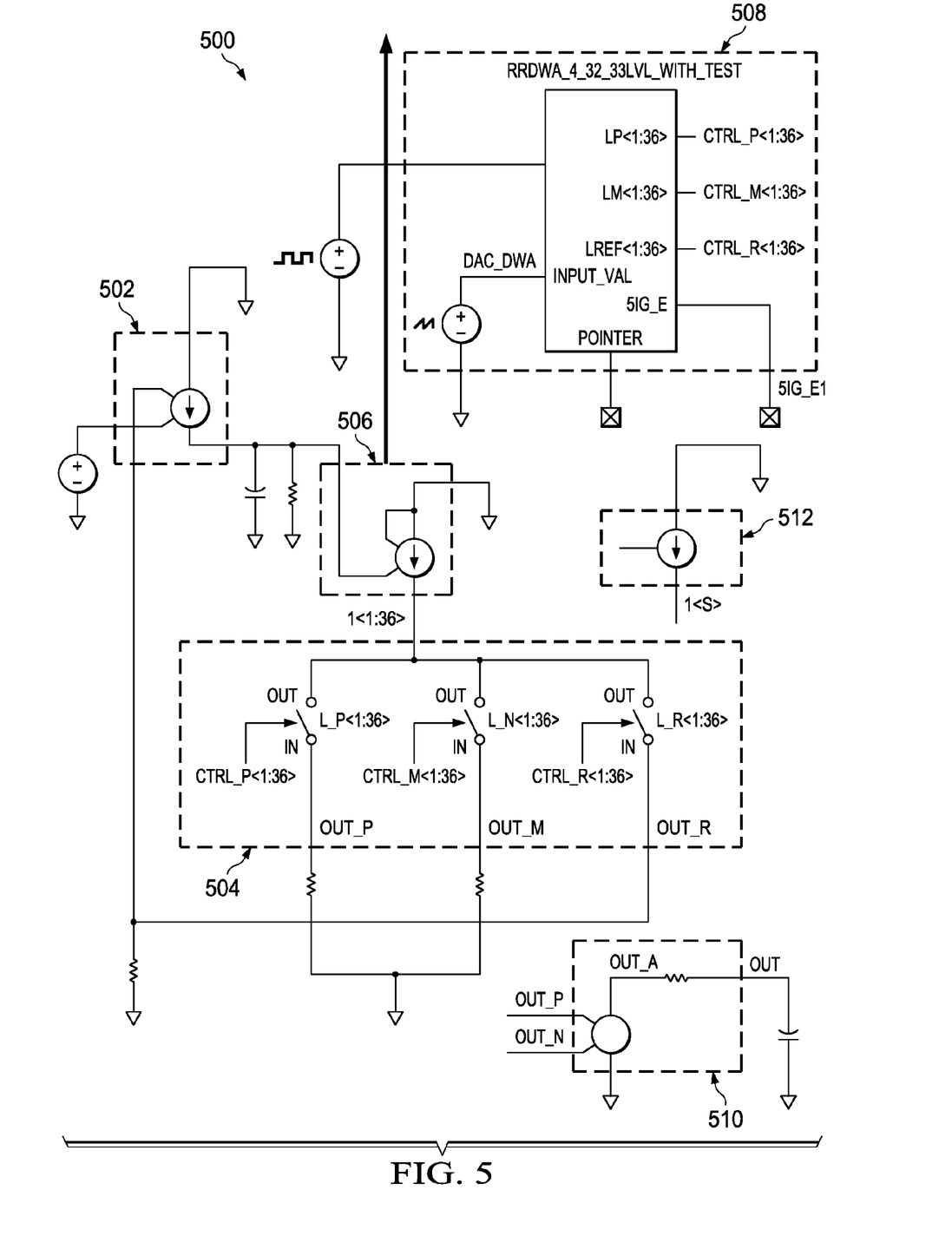
FIG. 5 shows a RRDWA DAC simulation circuit corresponding to the RRDWA DAC of FIG. 4 in accordance with an embodiment of the disclosure.

FIG. 5 shows a RRDWA DAC simulation circuit 500 corresponding to the RRDWA DAC 400 of FIG. 4 in accordance with an embodiment of the disclosure. In FIG. 5, op amp block 502 simulates the op amp 402 and DAC element array block 506 simulates the DAC element array 406. FIG. 5 also shows a controller block 508 and a element selection block 504. The controller block 508 simulates array index circuitry (e.g., as described for the array index circuitry 206 of FIG. 2) and the element selection block 504 simulates element selection logic (e.g., as described for the element selection logic 208 of FIG. 2 or the element selection logic 304 of FIG. 3). FIG. 5 also shows a flicker noise block 512 for simulating flicker noise and a DAC output block 510 that simulates providing a DAC output by combining P outputs and M outputs. For the simulation circuit 500, a low frequency tone is used to emulate flicker noise for ease of simulation. The total flicker noise power is then represented by the power of the tone.

Figure 6A:
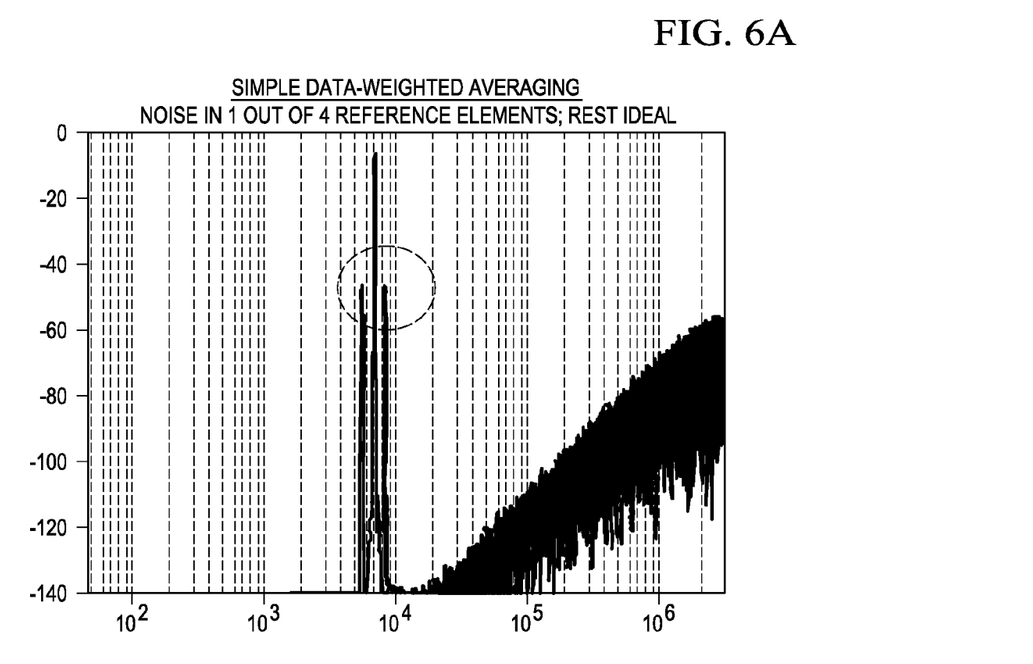
FIGS. 6A-6C show simulation results for the RRDWA DAC simulation circuit of FIG. 5 in accordance with an embodiment of the disclosure.
Figure 6B:
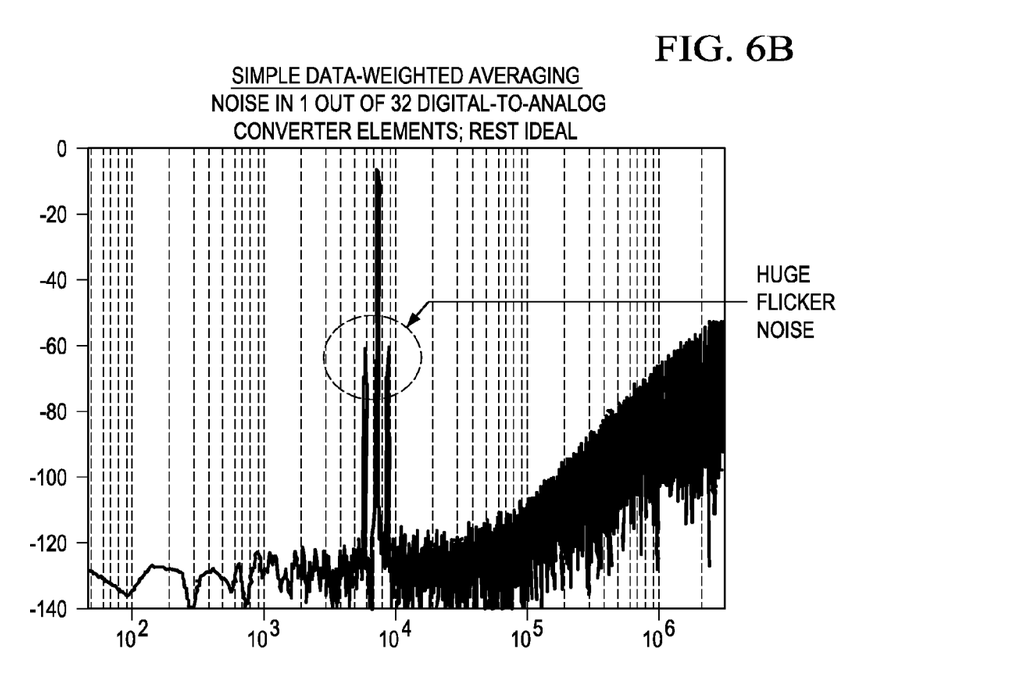
Figure 6C:
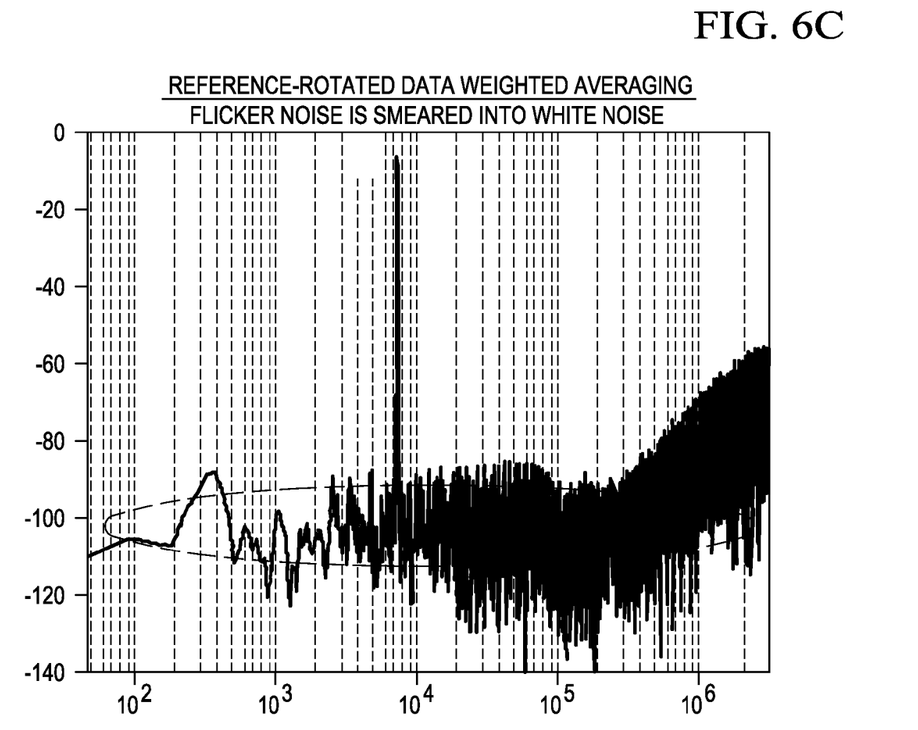

FIGS. 6A-6C show simulation results for the DAC simulation circuit of FIG. 5 in accordance with an embodiment of the disclosure. For the simulation results in FIGS. 6A-6C, each DAC element of DAC element array block 506 provides a current of 3.125 uA. In such case, the total current for 32 DAC elements selected as P outputs or M outputs is 100 uA and the total current for 4 elements selected as REF outputs is 12.5 uA. Further, the signal output from the DAC elements is simulated as a −6 dBFS signal and the flicker noise is simulated as a 1.42 kHz signal with a 0.25 uA peak.

In FIG. 6A, a simple DWA technique is simulated using simulation circuit 500. More specifically, the flicker noise is simulated in 1 out of 4 REF elements, with the other REF elements being ideal. In such case, flicker noise occurs on both sides of the −6 dBFS signal (approximately −40 dB below the −6 dBFS signal level). In FIG. 6B, a simple DWA technique is simulated using simulation circuit 500. More specifically, the flicker noise is simulated in 1 out of 32 DAC elements, with the other DAC element being ideal. In such case, flicker noise occurs on both sides of the −6 dBFS signal (approximately −60 dB below the −6 dBFS signal level). In FIG. 6C, an RRDWA technique is simulated using simulation circuit 500. More specifically, the flicker noise is simulated in 1 of 36 elements, with RRDWA applied (i.e., 4 of 36 elements are dynamically selected for each clock cycle as REF elements). In such case, flicker noise is smeared into white noise levels (approximately 80 to 90 dB below the −6 dBFS signal).

An analytical analysis of RRDWA further support the simulation results described herein. A noisy DAC element can be described as having two noise components. The first noise component is when the DAC element directs noise flow into the P output or M output. The second noise component is when the DAC element is part of the REF output by modulation of the gate voltage of the line after filtering by the unity gain frequency (UGF) of the REF amp (e.g., op amp blocks 402, 502, etc.). The first noise component can be modeled as $i_{n\_out1}=i_n \cdot a[n]$. The second noise component can be modeled as $i_{n\_out2}=-(LPF\{i_n \cdot (1-a^2[n])\}*32) \cdot x[n]$. For REF amp bandwidth much less than the clocking frequency $LPF\{i_n \cdot (1-a^2[n])\}$ is estimated as $i_n*(1/9)$. For the first and second noise models $a[n]=+1$ (if the noisy element connects to the P output), −1 (if the noisy element connects to the M output), or 0 (if the noisy element connects to the REF output). Since $i_n$ varies slowly, $i_n$ is assumed to be constant for short term analysis (t=32 clock cycles).

Accordingly, the combined first and second noise components can be modeled as $i_{n\_out}=i_{n\_out1}+i_{n\_out2}=i_n \cdot a[n]-\{(32/9)*i_n \cdot x[n]\}$. Assuming $a[n]$ has a signal component and a white noise component results in $a[n]=(32/9)*(x[n]+w[n])$. Thus, $i_{n\_out}$ can be written as $i_{n\_out}=(32/9)*i_n \cdot w[n]$, assuming $x[n]=0$. In other words, the modeled flicker noise $i_{n\_out}$ becomes white noise. Further analysis and simulation shows that thermal noise affects DAC elements approximately the same for simple DWA and RRDWA.

Figure 7:
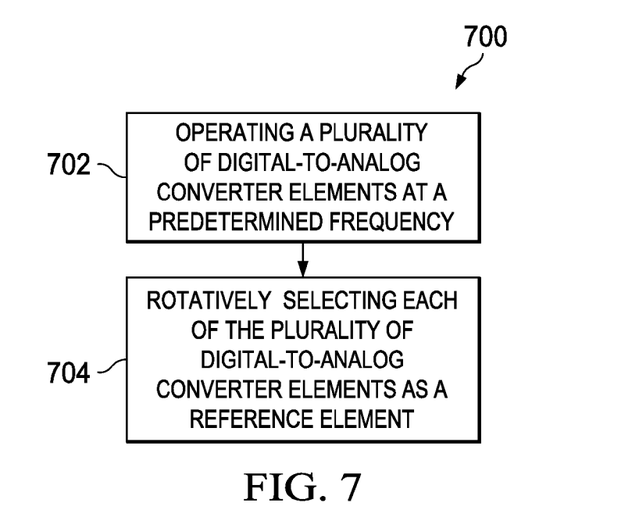
FIG. 7 shows a method in accordance with an embodiment of the disclosure.

FIG. 7 shows a method 700 in accordance with an embodiment of the disclosure. As shown, the method 700 comprises operating a plurality of DAC elements at a predetermined frequency (block 702). The method 700 further comprises rotatively selecting each of the plurality of DAC elements as a reference element (block 704). In some embodiments, "rotatively selecting" comprises selecting each of the plurality of DAC elements as a reference element approximately equally during DAC operation. Additionally or alternatively, "rotatively selecting" comprises selecting each DAC element as a reference element once for each of a plurality of selection cycles. In some embodiments, a random selection pattern is implemented for each selection cycle. Alternatively, a predetermined selection pattern is implemented for each selection cycle.

The method 700 may comprise additional steps that are added individually or in combination. As an example, the method 700 may additionally receiving a control code for each DAC operation cycle and causing DAC elements that are not selected as a reference element to provide a positive output or a negative output based on the control code.

In conclusion, simple DWA does not eliminate flicker noise of DAC elements. The flicker noise of a reference element for simple DWA does not result in a while noise floor for any signal amplitude. Meanwhile, the flicker noise of DAC elements for simple DWA results in a white noise floor for any signal amplitude. RRDWA operates to whiten flicker noise of DAC elements such that the flicker noise does not appear around the desired signal. The flicker noise whitening provided by RRDWA is independent of the REF amp bandwidth. Further, thermal noise in both RRDWA and simple DWA are substantially the same assuming the number of reference elements and DAC elements are equal.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An electronic device, comprising:
a digital-to-analog converter (DAC) having a DAC element array, wherein reference-rotated data weighted averaging (RRDWA) is applied to the DAC element array;
wherein said RRDWA whitens DAC element flicker noise into thermal noise levels and eliminates distortions due to DAC element mismatches.

2. A digital-to-analog converter (DAC), comprising:
a plurality of DAC elements, wherein each DAC element is selectable as a reference element;
element selection logic coupled to said DAC elements, wherein the element selection logic rotates DAC elements selected as reference elements; and
wherein the element selection logic causes each DAC element that is not selected as a reference element to be selected as one of positive output DAC element and a negative output DAC element.

3. The DAC of claim 2 wherein the element selection logic implements a reference element selection scheme that causes each DAC element to be selected as a reference element approximately equally during DAC operation.

4. The DAC of claim 3 wherein the reference element selection scheme selects each DAC element as a reference element once for each of a plurality of selection cycles.

5. The DAC of claim 4 wherein a random selection pattern is implemented for each selection cycle.

6. The DAC of claim 4 wherein a predetermined selection pattern is implemented for each selection cycle.

7. The DAC of claim 2 wherein the element selection logic selects DAC elements as positive output DAC elements and negative output DAC elements based on a control code.

8. A digital-to-analog converter (DAC) method, comprising:
operating a plurality of DAC elements at a predetermined frequency;
rotatively selecting each of the plurality of DAC elements as a reference element; and
receiving a control code for each DAC operation cycle and causing DAC elements that are not selected as a reference element to provide a positive output or a negative output based on the control code.

9. The DAC method of claim 8 wherein said rotatively selecting comprises selecting each of the plurality of DAC elements as a reference element approximately equally during DAC operation.

10. The DAC method of claim 8 wherein said rotatively selecting comprises selecting each DAC element as a reference element once for each of a plurality of selection cycles.

11. The DAC method of claim 10 further comprising implementing a random selection pattern is implemented for each selection cycle.

12. The DAC method of claim 10 further comprising implementing a predetermined selection pattern for each selection cycle.

* * * * *